United States Patent [19]

Slusky et al.

[11] 4,325,144

[45] Apr. 13, 1982

[54] HYSTERETIC SIS JUNCTION MIXER

[75] Inventors: Susan E. G. Slusky, East Brunswick; Ralph F. Trambarulo, Red Bank, both of N.J.

[73] Assignee: Bell Telephone Laboratories, Incorporated, Murray Hill, N.J.

[21] Appl. No.: 189,720

[22] Filed: Sep. 22, 1980

[51] Int. Cl.$^3$ .......................... H04B 1/26; H03F 7/00
[52] U.S. Cl. .................................. 455/324; 307/424; 330/4.5; 363/157; 455/325
[58] Field of Search .............................. 455/323–327, 455/330; 357/5; 307/306, 424; 330/4.5, 4.9; 363/157, 159

[56] References Cited

U.S. PATENT DOCUMENTS

| | | |
|---|---|---|
| 3,281,609 | 10/1966 | Rowell . |
| 3,573,632 | 4/1971 | Kuhn ..................................... 330/4.5 |
| 3,652,940 | 3/1972 | Reiter et al. ......................... 329/160 |
| 3,882,396 | 5/1975 | Schneider . |
| 3,895,300 | 7/1975 | Goldstein et al. ................ 332/51 W |
| 4,000,469 | 12/1976 | McMaster . |
| 4,188,584 | 2/1980 | Hoogstraate ........................ 363/159 |

OTHER PUBLICATIONS

Quasiparticle Heterodyne Mixing in SIS Tunnel Junctions—P. L. Richards et al. Mar. 1, 1979, *Applied Physics Letters*, vol. 34, No. 5 pp. 345–347.
Millimeter Wave Receivers with Subharmonic Pump—T. F. McMaster et al. Dec. 1976—IEEE Trans. on Microwave Theory & Techniques vol. MTT—24, No. 12 pp. 948–952.
Harmonically Pumped Stripline Downconverter—M. V. Schneider et al.—Mar. 1975 IEEE Transactions on Microwave Theory & Techniques, vol. MT—23, No. 3, pp. 271–275.
Conversion Gain & Noise in a Josephson Mixer—Y. Taur et al., Jan. 1974 Revue de Physique Appliquee, vol. 9, No. 1 pp. 263–268.
Four Photon Parametric Amplification—P. T. Parrish et al., Jan. 1974, *Revue de Physique Appliquee*, vol. 9, No. 1 pp. 229–232.
Four Photon Processes Stimulated by a Fluctuating Pump—L. I. Pavlov Spring/Summer 1979, *Applied Physics* vol. 18 pp. 105–108.
Analog Applications of the Josephson Effect: Recent Developments and Future Prospects—R. Y. Chiao, Jan. 1979, IEEE Trans. on Magnetics, vol. MAG-15, No. 1 pp. 446–449.
An Integrated 18 GHz Receiver Front End Using a Dielectric Resonator Stabilized Generator and a Subharmonically Pumped Mixer—I. Tatsuguchi et al., 1979 Int'l. Comm. Conf., Conf. Record, Boston, Mass. Jun. 10–14, 1979 pp. 26.2.1–26.2.5.
Development of a 183 GHz Subharmonic Mixer—R. E. Forsythe et al.-Apr. 30-May 2, 1979, 1979 IEEE MTT-S Int'l. Microwave Symposium Digest, pp. 20–21.
Physics of Superconducting Devices—B. S. Deaver, Jr., 1973, The Science and Technology of Superconductivity, W. D. Gregory, Ed., Plenum Press, New York pp. 539–564.

*Primary Examiner*—Marc E. Bookbinder
*Attorney, Agent, or Firm*—Erwin W. Pfeifle

[57] ABSTRACT

The present invention relates to a subharmonically pumped hysteretic superconductor-insulator-superconductor (SIS) junction mixer. The hysteretic junction (10), achieved by not suppressing the critical current $I_c$ of the junction, is responsive to a first source of a pump signal (12) at a frequency $\omega_p$ and a second source of an input signal (14) at a frequency $\omega_i$, to produce a nonzero output signal at a frequency $\omega_o = |\omega_i - 2\omega_p|$, during either an overpumped or underpumped condition. The hysteretic nature of the junction allows the mixer to operate in a switching mode, thereby producing low-noise mixing with gain.

5 Claims, 9 Drawing Figures

HYSTERETIC SIS JUNCTION MIXER

BACKGROUND OF THE INVENTION

1. Field of the Invention

The present invention relates to a hysteretic superconductor-insulator-superconductor (SIS) junction mixer and, more particularly, to a subharmonically pumped SIS junction mixer realized by not suppressing the critical current of the junction. The hysteretic mixer thus operates in a switching mode, providing effective low-noise mixing including conversion gain.

2. Description of the Prior Art

Subharmonically pumped mixing has been analyzed as early as 1976, as discussed in the article "Millimeter-Wave Receivers with Subharmonic Pump" by T. F. McMaster et al in *IEEE Transactions on Microwave Theory and Techniques,* Vol. MTT-24, Dec. 28, 1976 at pp. 948–952, and the related U.S. Pat. No. 4,000,469 issued to T. F. McMaster on Dec. 28, 1976. There, a frequency mixer-downconverter is dissolved which can be tuned as either a single sideband mixer or a double sideband mixer and which has a wide tunable RF bandwidth and low conversion loss. In the downconverter, a high frequency input signal is coupled from an input waveguide to a shielded suspended stripline, and two encapsulated Schottky barrier diodes are connected proximate to the waveguide-to-stripline transition between the inner conductor and the outer conducting channel of the stripline. The two diodes intermodulate the input signal with a subharmonic pumping signal which is also coupled to the suspended stripline from a separate waveguide input. An intermediate frequency signal, at a frequency equal to the difference between the input signal and twice the frequency of the pumping signal, is generated as an intermodulation product and transmitted on the suspended stripline to an output.

An alternative mixer arrangement is disclosed in U.S. Pat. No. 4,188,584 issued to H. Hoogstraate on Feb. 12, 1980 wherein the encapsulation surrounding the Schottky barrier diode intermodulator, as found in the hereinbefore mentioned McMaster arrangement, is removed, thereby increasing the bandwidth of the mixer over the prior art McMaster design.

The above-described mixers are built with an antiparallel Schottky barrier diode pair as the mixing element. A single Schottky barrier diode does not have the antisymmetric I-V characteristics neccessary for efficient subharmonically pumped mixing. In order to obtain an antisymmetric I-V characteristic, two matched Schottky barrier diodes are connected in anti-parallel.

Superconductor-insulator-superconductor (SIS) junctions do have naturally antisymmetric and highly nonlinear I-V characteristics as predicted by D. B. Josephson as early as 1962, where Josephson showed that a supercurrent would flow between two superconductors separated by a thin insulating barrier (i.e., a supercurrent tunnel junction). It is a characteristic of a superconducting tunnel junction which exhibits the Josephson effect, that the voltage acorss the junction remains zero over a range of supercurrents below a critical tunneling supercurrent. When the supercurrent flow through the junction exceeds the critical current, the voltage across the junction abruptly jumps to some higher value.

Further discovery in relation to these junction devices, as disclosed in U.S. Pat. No. 3,281,609 issued to J. M. Rowell on Oct. 25, 1966, found that as the junction current flow is reduced from above the critical supercurrent, a tunneling supercurrent less than the critical current is reestablished through the junction and the junction voltage again drops to zero, enabling these cryogenic junctions to function as switching and logic devices.

There are several mechanisms by which an SIS junction may be operated as a subharmonically pumped mixer. By suppressing the Josephson current with a magnetic field, as discussed by B. S. Deaver, Jr., in the article "Physics of Superconducting Devices", appearing in *The Science and Technology of Superconductivity,* W. D. Gregory, ed., Plenum Press, New York 1973, at page 559, an I-V characteristic very similar to the I-V characteristic for the antiparallel diode pair is obtained. Therefore, the analogous resistive mixing process is feasible.

The problem remaining in the prior art, then, is to achieve low-noise mixing with gain, utilizing the naturally antisymmetric SIS junction.

SUMMARY OF THE INVENTION

The problem remaining in the prior art has been solved in accordance with the present invention, which relates to a hysteretic superconductor-insulator-superconductor (SIS) junction mixer, and more particularly, to a subharmonically pumped SIS junction mixer realized by not suppressing the critical current of the junction. The hysteretic mixer thus operates in a switching mode, providing effective low-noise mixing including conversion gain.

It is an aspect of the present invention to provide an amplifying, near-linear hysteretic mixer as a component of a low-noise, millimeter-wave receiver, where a low-noise mixer with gain is desirable since any noise added in stages after the mixer is then less significant.

Other and further aspects of the present invention will become apparent during the course of the following description and by reference to the accompanying drawings.

BRIEF DESCRIPTION OF THE DRAWING

Referring now to the drawings, in which like numerals represent like parts in several views.

DETAILED DESCRIPTION

Figure 1:
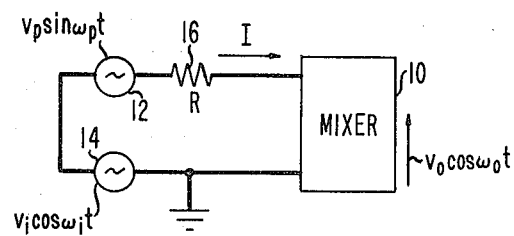
FIG. 1 illustrates an exemplary circuit arrangement including a hysteretic SIS junction mixer formed in accordance with the present invention.

As exemplary circuit including a hysteretic SIS junction mixer 10 formed in accordance with the present invention is illustrated in FIG. 1. The exemplary circuit includes a first source 12 of a pump signal of sinusoidal value $V_p \sin \omega_p t$ and a second source 14 of an input signal of sinusoidal value $V_i \cos \omega_i t$. First source 12 and second source 14 are connected in series and the signals therefrom are passed through a resistance 16, and applied as an input to a hysteretic mixer 10. The output of mixer 10 will be at a third frequency $\omega_o$, where $\omega_o$ is defined as $$\omega_o = |\omega_i - 2\omega|. \tag{1}$$

In the following analysis, the current, I, flowing through hysteretic mixer 10 will be analyzed in order to provide a clearer understanding of the operation of hysteretic mixer 10 as a function of $V_p, V_i, \omega_p$ and $\omega_i$.

Figure 2:
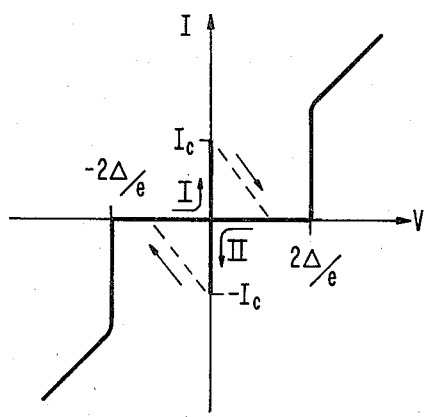
FIG. 2 illustrates the ideal I-V characteristic of the SIS junction mixer of FIG. 1 loaded with a resistance R less than the value $2\Delta/I_c e$.

Hysteretic mixer 10, as illustrated in FIG. 1, possesses the I-V characteristic illustrated in FIG. 2. The values $\mp I_c$ and $\pm 2\Delta/e$, as shown in FIG. 2, as well-known inherent properties of an SIS junction, respectively, the critical current and energy gap potential of the junction, and it will be assumed in the following description of the present invention that $R < 2\Delta/I_c e$, where R is the value of resistance 16 illustrated in the exemplary circuit of FIG. 1.

Figure 3:
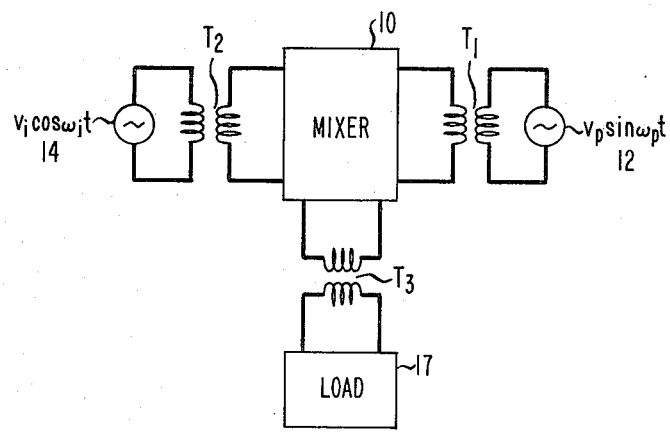
FIG. 3 illustrates an alternative arrangement of the circuit of FIG. 1 including transformer interconnection of a hysteretic SIS junction mixer with the remainder of the circuit.

FIG. 3 is an alternative embodiment of the present invention where first source 12, second source 14 and a load 17 are connected to mixer 10 through three separate transformers, $T_1, T_2 T_3$, respectively. As can be seen by reference to FIG. 3, first source 12 is connected to the primary winding of $T_1$ and the seconary winding of $T_1$ is connected to mixer 10. Likewise, the primary windings of $T_2$ and $T_3$ are connected to second source 14 and load 17, respectively, where the secondary windings of both are connected to mixer 10.

Figure 4:
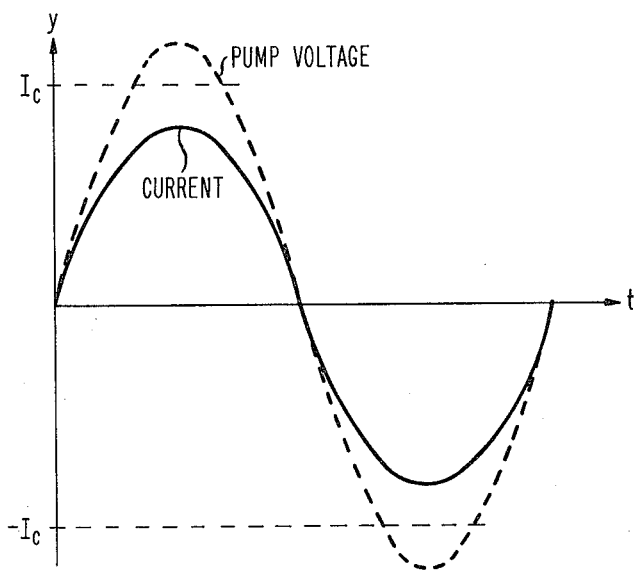
FIG. 4 is a graph illustrating the voltage waveform associated with the pump and the current waveform associated with the mixer of FIG. 1 or FIG. 3 for relatively low levels of pump signal and no input signal.

If second source 14 is not present in the circuit of FIG. 1 or FIG. 3, that is, $V_i = 0$, and the peak value of the pump signal from first source 12 is less than the value $I_c R$, no voltage will develop across hysteretic mixer 10, and the current through mixer 10 is sinusoidal and in phase with the voltage of the pump signal, $V_p \sin \omega_p t$, as illustrated in FIG. 4.

Figure 5:
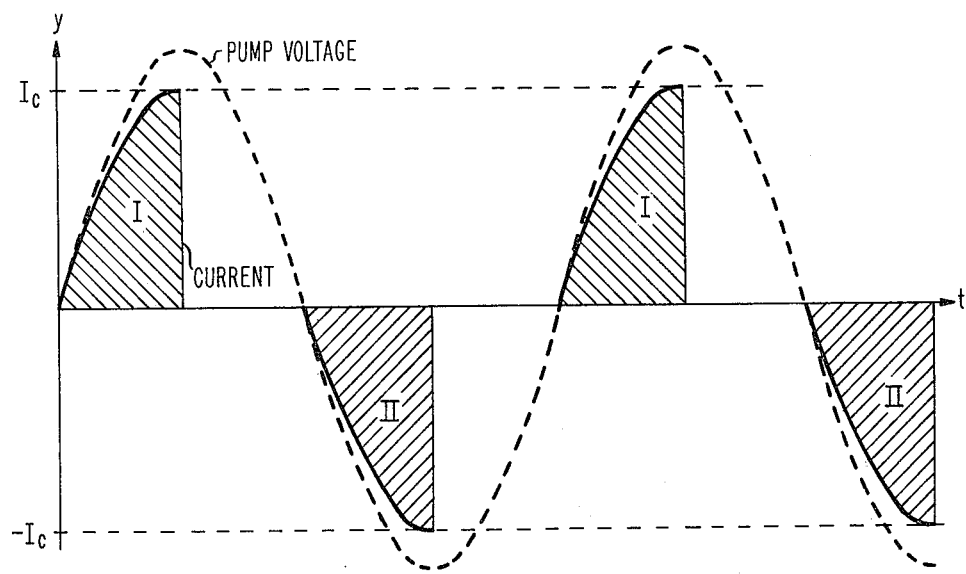
FIG. 5 is a graph illustrating the voltage waveform associated with the pump and the current waveform associated with the mixer of FIG. 1 or FIG. 3 for relatively high levels of pump signal and no input signal.

However, when the peak value of the pump signal from first source 12 exceeds the value $I_c R$, and second source 14 remains at zero, the current flow through mixer 10 is of the form illustrated in FIG. 5, which can be analyzed in accordance with the I-V characteristic of mixer 10 illustrated in FIG. 2. Shaded region I of FIG. 5 refers to the portion of the I-V characteristic of FIG. 2 where the value of the current flowing through mixer 10 follows the pump voltage $V_p \sin \omega_p t$ of the first source 12, increasing in value along the ordinate of FIG. 2 from the value $I = 0$ along arrow I to the value $I = I_c$. When the current through mixer 10 reaches the critical current $I_c$, the current flowing through mixer 10 follows the dotted line in the first quadrant of FIG. 2 back to the abscissa in a very short period of time. Due to the hysteretic nature of mixer 10, the current then ceases to flow until the sinusoidal pump voltage $V_p \sin \omega_p t$ of first source 12 crosses the axis and starts to flow in the negative direction. Shaded region II of FIG. 5, like shaded region I, represents the current flowing through mixer 10 as the current decreases in value from $I = 0$ along arrow II shown in FIG. 2 to the value $I = -I_c$. As with the positive half-cycle of the pump voltage, when the current flowing through mixer 10 reaches the critical current $-I_c$, it quickly decays in accordance with the dotted line in the third quadrant of FIG. 2 back to the abscissa, where it ceases to flow until the pump signal $V_p \sin \omega_p t$ from first source 12 begins the next positive half-cycle.

Given such current pattern, subharmonically pumped, homodyne mixing, that is, downconversion to d.c., may be analyzed. This mixing occurs when the input signal of second source 14 of FIG. 1 or FIG. 3 is sinusoidal having the form $V_i \cos \omega_i t$, where $\omega_i = 2\omega_p$. Therefore, in accordance with equation (1), mixer 10 will produce an output signal with a zero, or d.c., output frequency. Mixing will occur for both the underpumped ($V_p < I_c R$) and overpumped ($V_p > I_c R$) conditions, as will be described in greater detail hereinafter in the description associated with FIGS. 6 and 7.

Figure 6:
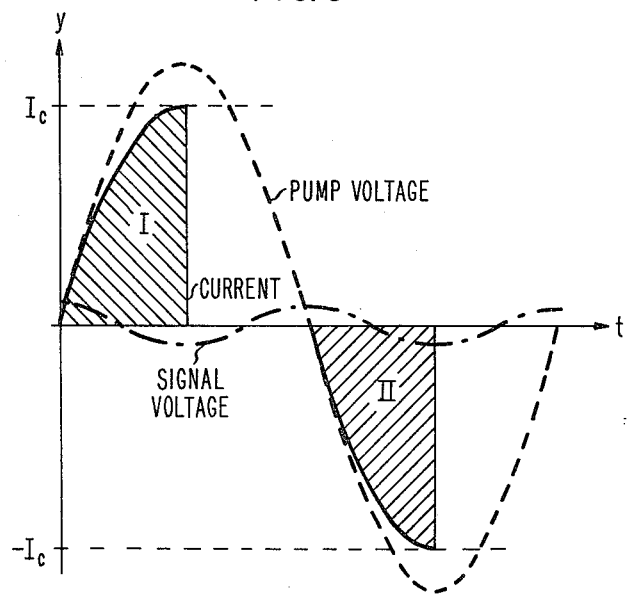
FIG. 6 is a graph illustrating the voltage waveforms associated with the pump and input sources and the current waveform associated with the mixer of FIG. 1 or FIG. 3 for relatively high levels of pump signal and relatively low levels of input signal under homodyne mixing conditions.

If mixer 10 is overpumped, that is, the peak value of the pump signal $V_p \sin \omega_p t$, $V_p$, from first source 12 exceeds the value $I_c R$ and $V_i$ is equal to zero, the current flowing through mixer 10 is as illustrated in FIG. 5. If a small input signal $V_i \cos \omega_i t$ of peak value $V_i < V_p - I_c R$ from second source 14 is also applied to mixer 10, the current flowing through mixer 10 is as illustrated in FIG. 6. In the first half-cycle of current flow, the signals from first source 12 and second source 14 reach their respective positive and negative peaks simultaneously. The negative value of second source 14 will cause the combination of these signals to exceed the critical current $I_c$ late in the first quarter cycle, which, therefore, in accordance with the hysteretic nature of mixer 10 illustrated in FIG. 2, will extend the current flow in the first quarter cycle beyond that of the flow illustrated in FIG. 5, as illustrated by shaded region I of FIG. 6. However, in the second half-cycle, the signals from first source 12 and second source 14 both reach their negative peaks simultaneously. Hence the absolute value of the combination of these signals will reach the critical current $I_c$ early in the third quarter cycle, and therefore, in accordance with the above-mentioned hysteretic nature of mixer 10, truncate the current flow in the third quarter cycle, as illustrated by shaded region II of FIG. 6, at an earlier point than that occurring for the current flow related to only the presence of the pump signal, as illustrated in shaded region II of FIG. 5. The extension of positive current flow and truncation of negative current flow results in a slight net positive d.c. current component, that is, homodyne mixing.

Figure 7:
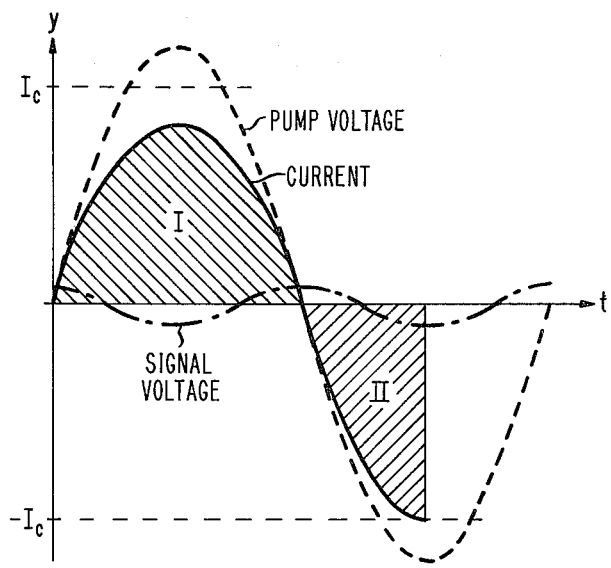
FIG. 7 is a graph illustrating the voltage waveforms associated with the pump and input sources and the current waveform associated with the mixer of FIG. 1 or FIG. 3 for either (a) relatively low levels of pump signal, or, (b) relatively high levels of both pump and input signals, under homodyne mixing conditions.

When mixer 10 is underpumped ($V_p < I_c R$), the current passing therethrough is as illustrated in FIG. 4. However, if an input signal from second source 14 is also applied to mixer 10, the current flow becomes as shown in FIG. 7. Unlike the overpumped case, the peak value of the signal from second source 14 is not a factor in determining the shape of the current waveform passing through mixer 10 in the underpumped mode. As illustrated by shaded region I of FIG. 7, the combination of the signals from first source 12 and second source 14 yields a current value which remains less than the critical current $I_c$ throughout the entire positive half-cycle of current flow since the signal $V_i \cos \omega_i t$ from second source 14 reaches its negative extreme at the same time the pump signal $V_p \cos \omega_p t$ from first source 12 reaches its positive extreme. However, during the negative half-cycle, the signals from first source 12 and second source 14 reach their negative peaks simultaneously. Therefore, the current flowing through mixer 10 will exceed the critical current $I_c$ during the third quarter cycle, and current will cease to flow through mixer 10 due to the hysteretic nature of mixer 10, as illustrated in FIG. 2. Since mixer 10 is hysteretic, no current will flow until the combination of the pump and input signals from first source 12 and second source 14 exceeds zero. As can be seen by reference to shaded regions I and II of FIG. 7, this underpumped condition results in a larger net positive d.c. current component, that is, downconverted power, then the overpumped condition illustrated in FIG. 6.

The current flow through mixer 10 as illustrated in FIG. 7 may also be used to explain the overpumped, large signal, condition, where the peak value, $V_i$, of the input signal from second source 14 exceeds the value $V_p - I_c R$. As illustrated by shaded region I in FIG. 7, the large peak value of second source 14 reaches its negative extreme at the same time the pump from first source 12 reaches its positive extreme, therefore, the combination of these signals will yield a current flow remaining less than the critical value $I_c$ throughout the entire positive half-cycle. However, during the negative half-cycle, the signals from first source 12 and second source 14 reach their negative peaks simultaneously, causing the current through mixer 10 to cease flowing during the third quarter cycle when the value of the current flowing through mixer 10 exceeds the critical current $I_c$. As can be seen by reference to shaded regions I and II of FIG. 7, this overpumped, large signal, condition results in a net positive d.c. current component, much larger in magnitude than the overpumped, small signal, condition discussed hereinbefore and illustrated in FIG. 6.

Therefore, for all input signals from second source 14 of peak value $V_i > V_p - I_c R$, whether overpumped or underpumped, the current flow through mixer 10 will resemble that shown in FIG. 7. Further increases in signal from second source 14 will only change $V_i + V_p$, which, in turn, determines the point in the third quarter cycle at which the current through mixer 10 ceases to flow, thereby only changing the magnitude of the d.c. current component, or downconverted power, available at mixer 10.

Subharmonically pumped, heterodyne mixing, as opposed to the above-described homodyne mixing process, occurs when the frequency of the input signal, $\omega_i$, is not equal to twice the pump frequency $\omega_p$. For the heterodyne case, the output of the junction will not be at d.c., but rather at a third frequency equal to the combination of the input and pump frequencies as defined by equation (1).

Figure 8:
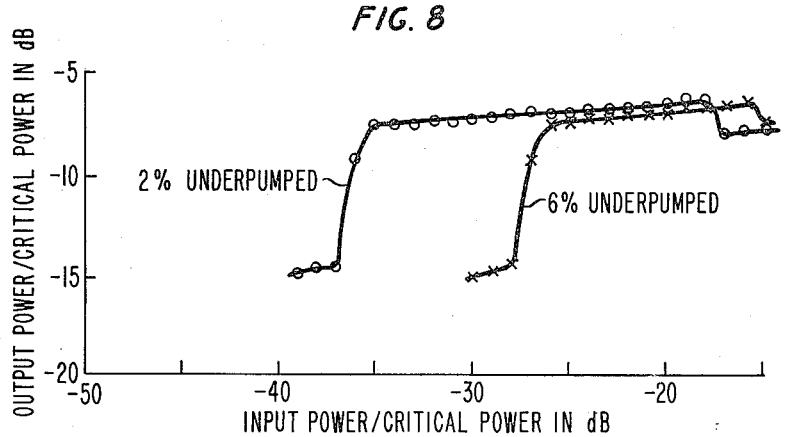
FIG. 8 contains a log-log graph of normalized output power vs. normalized input power associated with a computer simulation of the operation of the mixer of FIG. 1 of FIG. 3 operated as a heterodyne underpumped mixer.
Figure 9:
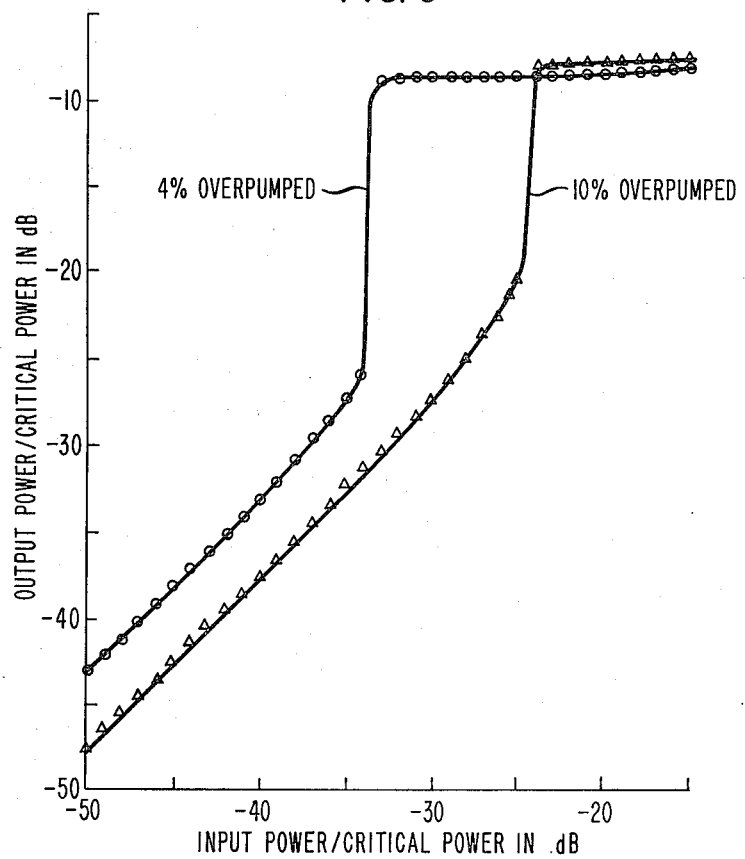
FIG. 9 contains a log-log graph of normalized output power vs. normalized input power associated with a computer simulation of the operation of the mixer of FIG. 1 or FIG. 3 operated as a heterodyne overpumped mixer.

Heterodyne mixing will occur for both underpumped and overpumped conditions, as can be determined from FIGS. 8 and 9, respectively, where FIGS. 8 and 9 contain log-log plots obtained through computer simulations of output power vs. input power of the heterodyne mixer operated in the above-mentioned underpumped and overpumped modes, respectively. Input power is defined as the available power, $V_i^2/8R$, and output power is defined as $I_2^2 R/2$, where $I_2$ is the amplitude of the Fourier component of the total current at the frequency $\omega_o$ as defined by equation (1). In the log-log representations of both FIGS. 8 and 9, the input and output powders are normalized by the critical power $I_c^2 R/2$, the power needed to bring the maximum current in the junction to the critical current value. The amount of gain produced by the heterodyne mixer may thus be obtained by comparing the relative input power value to the relative output power value.

The amount of underpumping or overpumping is also referenced to the critical power $I_c^2 R/2$. For example, 2% underpumping is defined by the equation.

$$1.02(V_p^2/2R) = I_c^2 R/2. \qquad (2)$$

As can be seen by reference to FIG. 8, underpumping yields highly non-linear results. When the pump power is 2% less than the critical power, the peak pump voltage is 1% less than $I_c R$. The current flow, as illustrated in FIG. 7, should therefore commence when the peak signal voltage exceeds 1% of $I_c R$. Thus, the input power-to-critical power ratio must exceed 0.0001 or $-40$ dB for the output signal, and hence, output power, to exist. This condition is illustrated in FIG. 8, where the input power-to-critical power ratios of $-40$ dB and below, no output power exists. Once the above-mentioned ratio goes above the $-40$ dB level, output power exists, and non-linear gain is present from the point until at least $-15$ dB. Underpumping the junction by six percent is also illustrated in FIG. 8. As with the above-mentioned 2% underpumped case, 6% underpumping results in non-linear gain, in this instance over the range of approximately $-30$ dB to at least $-15$ dB.

Overpumping, as illustrated in FIG. 9, results in an amplifying mixer which is near-linear over a broad range. For 4% overpumping, as defined by the equation $$V_p^2/2R = 1.04(I_c^2 R/2), \qquad (3)$$

the output power-to-critical power ratio is approximately a linear function of the input power-to-critical power ratio from the output value of approximately $-43$ dB at the input value of $-50$ dB to the approximate output value of $-29$ dB at the input value of $-36$dB resulting in signal gain in the range of approximately 6.8 dB to 7.3 dB. As the input power-to-critical power ratio exceeds $-34$ dB, the total voltage remains less than $I_c R$ over one-half of the pump cycle, and in accordance with the hysteretic nature of the junction, the output power-to-critical power ratio abruptly jumps from approximately $-26$ dB to approximately $-9$ dB. Ten percent overpumping results in a nearly linear gain of approximately 2.4 dB to 2.9 dB until the input power-to-critical power ratio reaches approximately $-29$ dB. As with the 4% overpumping, once the total voltage does not exceed $I_c R$ during 10% overpumping, the output power-to-critical power ratio will abruptly jump from approximately −20 dB to approximately −7 dB, in accordance with the hysteretic nature of the junction as illustrated in FIG. 2.

We claim:

1. A mixer comprising:
   a first source (12) producing a pump signal at a first frequency ($\omega_p$);
   a second source (14) producing an input signal at a second frequency ($\omega_i$); and
   a superconductor-insulator-superconductor (SIS) junction being responsive to said first and second sources and producing an output signal at a third frequency ($\omega_o$), said output signal including regions of positive and negative value
   characterized in that
   the SIS junction possesses a hysteretic current-voltage chacteristic defined by predetermined positive and negative extreme critical current values ($\pm I_c$), said junction operating in a switching mode so that it is responsive to the pump and input signals such that the third frequency ($\omega_o$) of the output signal produced by said junction is equal to the absolute value of the difference of twice the first frequency ($\omega p$) of said pump signal and the second frequency ($\omega_i$) of said input signal.

2. A mixer in accordance with claim 1 characterized in that
   the second source produces an input signal at a second frequency ($\omega_i$) equal to twice the frequency ($\omega_p$) of the pump signal produced by the first source, enabling the junction to produce an output signal at a third frequency ($\omega_o$) equal to zero.

3. A mixer in accordance with claim 1 characterized in that
   the second source produces an input signal at a second frequency ($\omega_i$) not equal to twice the frequency ($\omega_p$) of the pump signal produced by the first source, enabling the junction to produce an output signal at a third frequency ($\omega_o$) not equal to zero.

4. A mixer in accordance with claims 2 or 3 characterized in that
   the first and second sources produce signals which in combination exceed both the positive and negative extreme critical current values, enabling said junction to modify both the regions of positive and negative value of said outut signal.

5. A mixer in accordance with claims 2 or 3 characterized in that
   the first and second sources produce signals which in combination exceed only one of the predetermined critical current values, enabling said junction to modify only one of the regions of positive and negative value of said output signal.

* * * * *